United States Patent [19]
Edwards et al.

[11] Patent Number: 5,834,763
[45] Date of Patent: Nov. 10, 1998

[54] LOW NOISE PHOTON COUPLED CIRCUIT

[76] Inventors: Paul Julian Edwards, 3 Redgrove Place, Chapman, A.C.T., 2611, Australia; Wood Nang Cheung, 19 Sherlock Street, Kaleen, A.C.T., 2617, Australia

[21] Appl. No.: 809,079

[22] PCT Filed: Sep. 14, 1995

[86] PCT No.: PCT/AU95/00599

§ 371 Date: Mar. 14, 1997

§ 102(e) Date: Mar. 14, 1997

[87] PCT Pub. No.: WO96/08857

PCT Pub. Date: Mar. 21, 1996

[30] Foreign Application Priority Data

Sep. 14, 1994 [AU] Australia ................................ PM8120
Dec. 12, 1994 [AU] Australia ................................ PM9986

[51] Int. Cl.⁶ .................................................... H01J 40/14
[52] U.S. Cl. ..................... 250/214 A; 250/205; 327/515; 330/59
[58] Field of Search ........................... 250/214 A, 214 R, 250/214 C, 205, 206; 327/515, 514, 530; 330/59, 308

[56] References Cited

U.S. PATENT DOCUMENTS 4,876,442 10/1989 Fukushima ............................... 250/205

*Primary Examiner*—Que Le
*Attorney, Agent, or Firm*—Sterne, Kessler, Goldstein & Fox P.L.L.C.

[57] ABSTRACT

A photon coupled circuit comprises a high quantum efficiency semiconductor light emitter (TDA) coupled with low photon losses to a high quantum efficiency semiconductor light detector (OLD). Bias current is provided to both the light detector (OLD) and light emitter (TDA). The light output of the light emitter (TDA) is modulated by the signal current flowing therein and the current flowing ($i_o$) in the detector (OLD) is modulated by the light received from the light emitter (TDA). The quantum transfer efficiency or open loop current gain is greater than 0.5 and a portion of the AC current flowing in the light detector (OLD) is applied as feedback to reinforce or oppose the current flowing in the light emitter (TDA).

17 Claims, 5 Drawing Sheets

LOW NOISE PHOTON COUPLED CIRCUIT

TECHNICAL FIELD

This invention relates to optoelectronic coupling and more particularly to a photon coupled circuit for applications including low noise optocoupling, optical interconnects, current amplifiers, light amplifiers and optical bistable devices. As used herein, the term "photon coupled circuit" refers to a configuration of optoelectronic devices which are photonically and electronically coupled.

BACKGROUND ART

Many prior art devices achieve a current amplification by the use of active electronic circuits. Such devices are not able to offer a low noise operation and in particular are often limited by the shot noise in the system. Australian patent 648682 describes a means of generating multiple noise-correlated lightwave beams in order to suppress shot noise in optical measurement systems.

DISCLOSURE OF INVENTION

It is an object of this invention to provide a sub-shot noise photon coupled amplifier circuit through quantum noise suppression and to provide increased gain or increased bandwidth to the circuit through the application of AC feedback.

Accordingly, in one aspect this invention consists in a sub-shot noise, optoelectronic amplifier circuit comprising a high quantum efficiency semiconductor light emitter; means to provide signal input current and bias current to said light emitter, the light output of said light emitter being controlled by the current flowing therein; a high quantum efficiency semiconductor light detector optically coupled with low photon losses to said light emitter to provide an overall quantum transfer efficiency in excess of 0.5; means to provide a bias voltage to said light detector, the current flowing in said light detector being controlled by the light received from said light emitter and used to provide an output signal; means to isolate a portion of the alternating current flowing in said detector and to feed this portion of the alternating current back to reinforce or oppose the signal current flowing in the light emitter.

In one form of the invention the feedback is positive to reinforce the signal current flowing in a light emitter and thus to provide increased AC current gain exceeding unity. In another form of the invention the feedback is negative in order to oppose signal current flowing in the light emitter and thus to provide increased bandwidth. As used herein, the term quantum transfer efficiency refers to the efficiency of the transfer of the current modulating the light emitter into current flowing in the light detector. It is therefore equal to the open loop current gain of the circuit.

In one form of the invention the light emitter comprises an array of high quantum efficiency laser diodes or light emitting diodes which are driven by a signal current from a high impedance source.

In one form of the invention using an array of high quantum efficiency semiconductor light emitting or laser diode junctions, the product of the number of elements in the array and the value of the quantum transfer efficiency between each element and the light detector is much greater than 1. In this case the quantum partition noise introduced in the coupling between the light emitting array and the detecting system is negligible and negative feedback may be applied to widen the bandwidth of the system.

In another form of the invention, employing a single light emitter the quantum transfer efficiency preferably exceeds 0.75 and ideally is as close to unity as possible.

Preferably, the light detector comprises a back biassed PIN photo diode operating in photoconductive mode.

The high quantum transfer efficiency between the light emitter and the light detector is preferably achieved by low loss photon coupling through close physical positioning as for example, in an optoelectronic integrated circuit (OEIC) together with selection of high quantum efficiency light emitters and light detectors. Low loss photon coupling can also involve the use of an optical waveguide or a low loss light pipe.

In one form of the invention the current in the light emitter is preferably modulated by the current output of an additional light detector. The device then functions as a light receiver. In an alternative arrangement an input light signal from an external source is received by the light detector and the current flowing in the light detector is modulated by the input light signal.

In another form of the invention the current flowing in the light detector is used to drive individual or arrays of semiconductor laser or light emitting junctions.

The photon coupled circuit of this invention can be used as the basis of an optocoupler, optical interconnect, optical amplifier, electronic amplifier, optoelectronic oscillator, optoelectronic multivibrator or optoelectronic bistable device.

BRIEF DESCRIPTION OF DRAWINGS

One embodiment of the invention will now be described, by way of example only, with reference to the accompanying drawings in which.

BEST MODE FOR CARRYING OUT THE INVENTION

Figure 1:
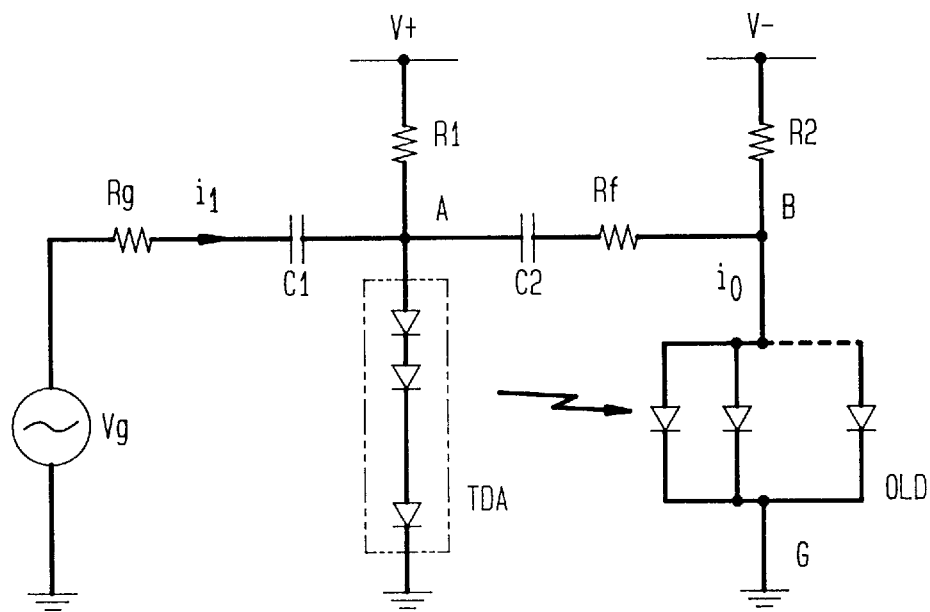
FIG. 1 shows a photon coupled current amplifier according to this invention.

FIG. 1 shows the circuit of an optocoupler amplifier. An array of series connected semiconductor junction light emitting diodes (or laser diodes) TDA each of high quantum efficiency is shown modulated by a voltage source $v_g$ with internal impedance $R_g$. It is connected to the array through a blocking capacitor $C_1$ and the DC bias current for the array is provided through resistance $R_1$. The light from this array is efficiently collected by an array of PIN diodes OLD which is biased through resistance $R_2$.

A fraction of the current output from the detector is fed back from point B through the feedback resistance $R_f$ and the blocking capacitor $C_2$ to the input of the light emitting array at point A to provide positive current feedback The amplified current output is available between points A and B or between B and G. The noise behaviour of the positive feedback amplifier will depend on the quantum efficiency of the optoelectronic conversion and the noise figure is expected to improve as the quantum efficiency is increased. In the following analysis, a LED model which has been found useful for both small signal and noise performance evaluations is used.

Let

N=number of LEDs in series
η=differential quantum efficiency per device
$r_d$=differential resistance of the LED
$r_s$=bulk resistance of the LED
$r_{sd}=r_s+r_d$
$R_1$=bias resistance for the LED array
$R_2$=includes the bias and load resistance at the output
$R_f$=feedback resistance (or impedance in general).

Figure 2:
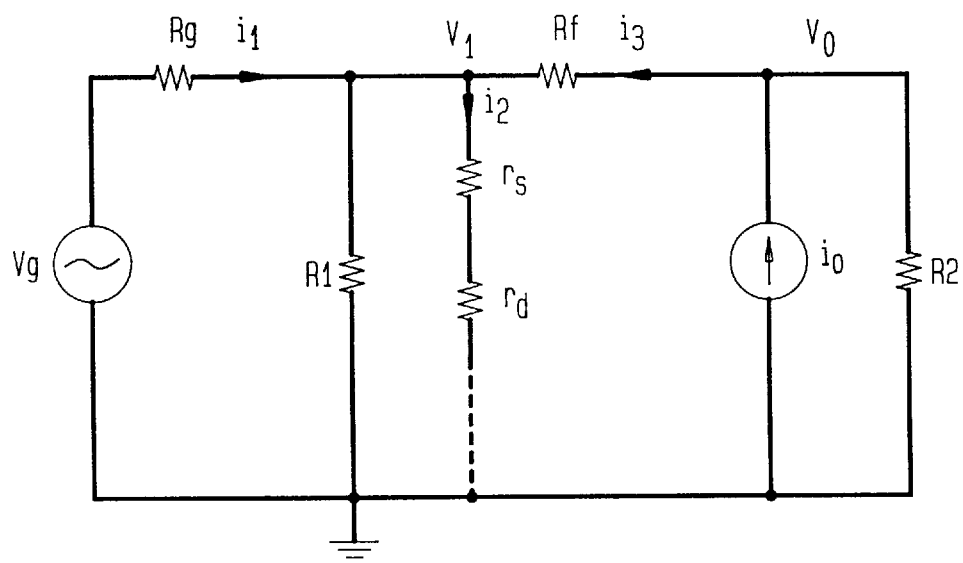
FIG. 2 shows an AC equivalent circuit of the amplifier shown in FIG. 1.

The low-frequency small signal equivalent circuit for the system is shown in FIG. 2. It is assumed that the LEDs are identical and that the detector generates an output current given by $i_0=N(\eta i_2)$, where $i_2$ is the signal current flowing through the LED array. The impedance of the detector is assumed to be high compared with $R_f$ or $R_2$. With $i_1$ equal to the current from the signal source, it can readily be shown that the closed-loop current gain of the amplifier is given by $$A_i = \frac{i_0}{i_1} = \frac{A_0}{1 - A_0\beta} \quad (1)$$

where $A_0$ is the open-loop current gain given by $$A_0 = N\eta \left( \frac{R_1}{R_1 + Nr_{sd}} \right) \quad (2)$$

and β is the feedback factor given by $$\beta = \frac{R_2}{R_f + R_2} \left( 1 - \frac{r_{sd}}{\eta R_2} \right) \quad (3)$$

For stability reasons, the amplifier must operate such that the loop gain $A_0\beta$ is less than unity. If $R_1$ and $R_2$ are large compared with the device resistance $r_{sd}$, the open-loop gain becomes Nη and the feedback factor simplifies to $R_2/(R_f+R_2)$.

The input impedance of the opto-amplifier is given by $$R_{imp} = \frac{v_1}{i_1} = \frac{A_i'' r_{sd}}{\eta} \quad (4)$$

The effect of the LED bias resistance $R_1$ on the input resistance is already included in the expression for the current gain.

It can also be shown that the voltage gain of the feedback amplifier is given by $$A_v = \frac{v_0}{v_1} = 1 + \frac{R_f R_2}{R_f + R_2} \left( \frac{\eta}{r_{sd}} - \frac{1}{R_2} \right) \quad (5)$$

Figure 3:
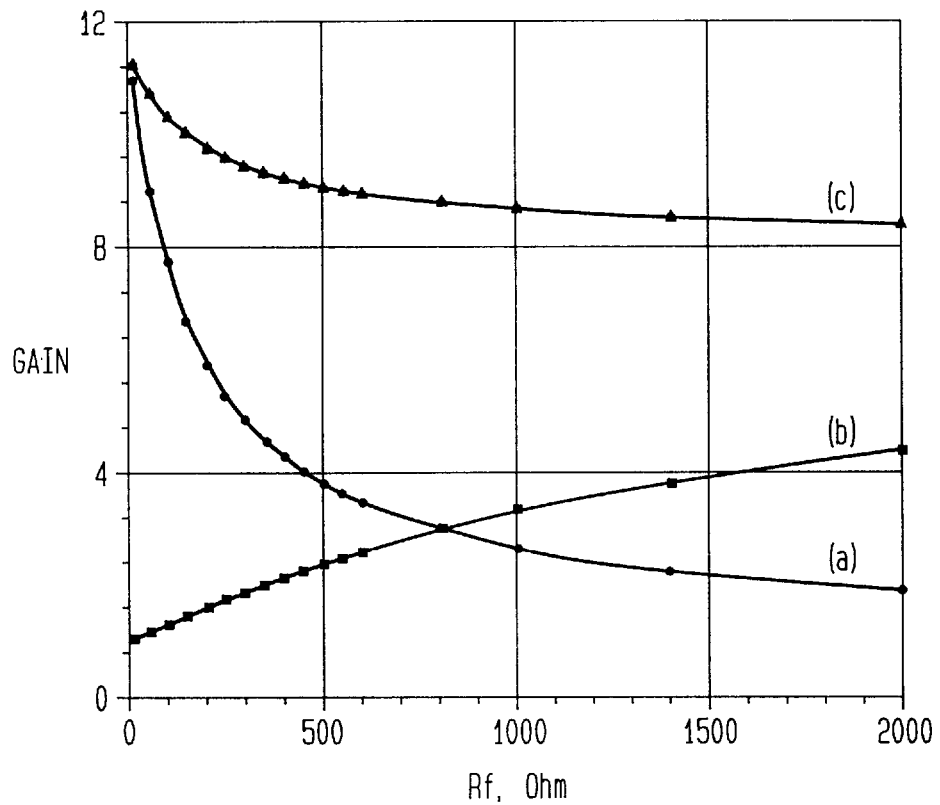
FIG. 3 shows (a) current gain, (b) voltage gain and (c) power gain of the photon coupled amplifier shown in FIG. 1.

It will be noted that while the current gain is proportional to the number of LEDs in the array, the voltage gain is independent of N. When $R_f=\infty$, $A_v$ reduces the open-loop value of $\eta R_2/r_{sd}$. For a given circuit, the voltage gain increases as the LED bias current increases. This is because the device resistance decreases as the bias current goes up. The apparent power gain of the feedback amplifier is given by $P_0/P_1=A_vA_i$, where $P_1=v_1i_1$ is the input signal power and $P_0=v_0i_0$ is the output signal power from the detector. FIG. 3 shows typical variations of current gain, voltage gain and power gain of the amplifier as a function of the feedback resistance.

At high frequencies, the LED junction can be represented by a parallel RC circuit. The rate of photons produced, $n_p$, is related to the diode injection current $i_2$ by $$n_p = \frac{i_2 j_q}{1 + j\omega\tau_c} \quad (6)$$

where $\tau_c$ is the charge recombination constant and q is the electronic charge. The detector current is given by $$i_o = N\eta n_p q = N\eta(\omega)i_2 \quad (7)$$

where $\eta(\omega)=\eta/(1+j\omega\tau_c)$. The high-frequency gain of the amplifier can be found using (2), (3) and (5) with η replaced by η(ω). Assuming the LED resistance to be small then $\beta=R_2/(R_f+R_2)$ and consequently $$A_i = \frac{N\eta(\omega)}{1 - N\eta(\omega)\beta} = \frac{N\eta}{1 - N\eta\beta + j\omega\tau_c} \quad (8)$$

The 3 dB bandwidth is thus given by $(1-N\eta\beta)/\tau_c$ and the gain-bandwidth product is $N\eta/\tau_c$. This result is consistent with positive feedback, ie, an increase in low-frequency gain is accompanied by a corresponding reduction in bandwidth. While the GB product is independent of feedback, it is proportional to N which can be increased by using more LEDs in the array.

If wide bandwidth is of primary concern, negative feedback can be used. To implement negative feedback in the photon coupled amplifier of FIG. 1, the polarities of the detectors are reversed and the negative bias supply (V−) is replaced by a positive bias supply. This causes the detector current ($i_0$) to reverse in direction. The analysis of the negative feedback amplifier follows the same lines as for positive feedback except that $i_0$ is now given by $-N\eta i_2$, indicating a change of direction of current flow. In comparison with the positive feedback structure, −η is assigned instead of η to equations (1)–(3) to give the current gain of the negative feedback opto-amplifier, ie.

$$A'_1 = \frac{i_0}{i_1} = \frac{A'_0}{1 - A'_0\beta'} \quad (9)$$

where $A_0'$ is the open-loop current gain given by $$A'_0 = -N\eta \left( \frac{R_1}{R_1 + Nr_{sd}} \right) \quad (10)$$

and β' is the feedback factor given by $$\beta' = \frac{R_2}{R_f + R_2} \left( 1 + \frac{r_{sd}}{\eta R_2} \right) \quad (11)$$

For large values of $R_1$ and $R_2$, the open-loop gain reduces to $A_0'=N\eta$ while the feedback factor becomes $\beta'+R_2/(R_f+R_2)$, which is equal to β in the case of positive feedback. Therefore the current gain is $$A'_1 = \frac{-N\eta}{1 + N\eta\beta + jw\tau_c} \quad (12)$$

It can readily be shown that the magnitude of the amplifier gain will drop to $N\eta/(1+N\eta\beta)$ while the bandwidth increases to $(1+N\eta\beta)/\tau_c$, with GB again given by $N\eta/\tau_c$. By stacking a number of high quantum efficiency LEDs in a negative feedback array amplifier, the bandwidth of the amplifier can be made to substantially exceed the intrinsic bandwidth ($1/\tau_c$) of a single LED.

Figure 4:
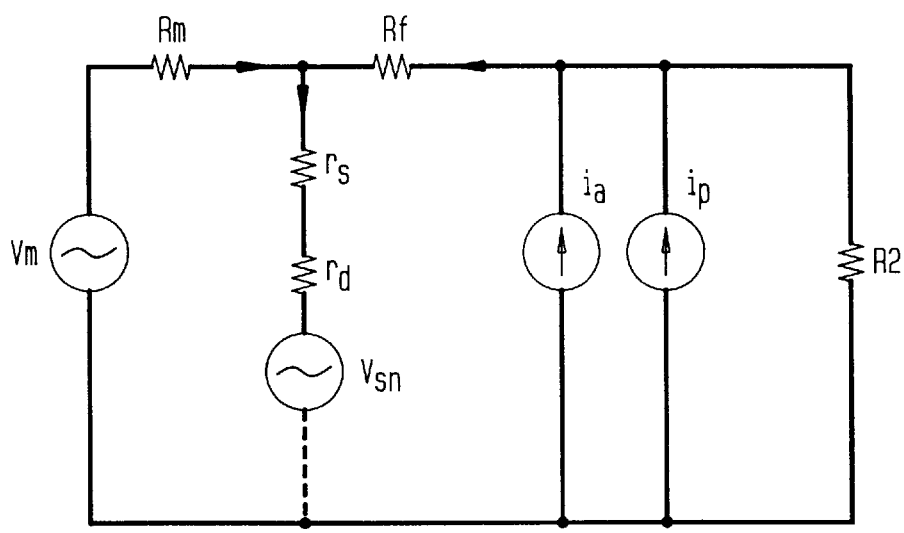
FIG. 4 is an AC equivalent circuit of the photon coupled amplifier used for noise calculations.

The noise spectral density of the detector current consists of two components: the transmitted diode array current noise and the photon partition noise. The partition noise arises from the Bernoulli photon deletion process due to nonideal quantum efficiency. The photon current noise, on the other hand, is the sum of all the random events which independently modulate the injection current of the LED. It consists of the thermal noise of the circuit resistances, the short noise in the LEDs and the feedback of any current fluctuations in the detector, including partition noise A low-frequency noise equivalent circuit of the positive feedback opto-amplifier is shown in FIG. 4. $R_m$ represents the parallel combination of $R_g$ and $R_1$, and the equivalent input voltage is give by $V_m = V_g(R_m/R_g)$. The RMS shot noise voltage of each LED is represented by $v_{sn} = I_s r_d$ where $i_s$ is the RMS shot noise current. The thermal noise voltage associated with each of the resistances $R_m$, $R_f$, $R_2$ and $Nr_s$ has been omitted from the figure for the sake of clarity.

It has been shown that the partition noise is given by $$<i_p^2> = N\eta(1-\eta)2qI = N\eta(1-\eta)<i_s^2> \quad (13)$$

where q is the electronic charge, I the LED bias current, and $<i_s^2>(=2qI)$ is the mean square shot noise current spectral density. Standard noise analysis of the circuit of FIG. 4 gives the transmitted photon current noise due to thermal and shot noise sources:

$$<i_a^2> = \left(\frac{N\eta}{1-N\eta\alpha}\right)^2 \left(\frac{2W}{\mu}\right) <i_s^2> \quad (14)$$

where $$\alpha = \frac{\eta R_2 - r_{sd}}{\eta(R_f + R_2)} - \frac{r_{sd}}{\eta R_m} \quad (15)$$

$$W = \frac{r_d}{R_m} + \frac{r_d}{R_f + R_2} + N\left(\frac{r_d}{R_p}\right)^2 \left(\frac{r_s}{r_d} + \frac{\mu}{2}\right) \quad (16)$$

The total output noise current is given by $$<i_{no}^2> = <i_g^2> + U^2 <i_p^2> \quad (17)$$

where $$U = 1 + \frac{N\eta}{1-N\eta\alpha}\left(\frac{R_2}{R_f + R_2}\right) \quad (18)$$

The second term in (17) represents the total effect of the partition noise, ie, it consists of the open-loop partition noise and the returned partition noise through the feedback loop.

Similar circuit analysis yields the output signal current $$i_{so} = \frac{V_g}{R_g} \frac{N\eta}{1-N\eta\alpha} \quad (19)$$

where $V_g$ is the input signal voltage. The output signal-to-noise ratio is therefore given by $$SNR_o = \frac{(V_g/R_g)^2}{<i_s^2>} \left[\frac{2W}{\mu} + \frac{1-\eta}{N\eta}(1-N\eta\alpha)^2 U^2\right]^{-1} \quad (20)$$

The input signal and noise are defined as the LED modulation currents due to the signal source $V_g$ and the thermal noise of the source resistance $R_g$, respectively. Thus the input SNR is given by $$SNR_i = V_g^2/4 \, kTR_g = \frac{(V_g/R_g)^2}{<i_s^2>} \left(\frac{\mu R_g}{2r_d}\right) \quad (21)$$

where $r_d = \mu kT/qI$, $\mu$ being the ideality factor.

Finally, the noise figure of the feedback amplifier is given by $$F = SNR_i/SNR_o = \left(\frac{\mu R_g}{2r_d}\right)\left[\frac{2W}{\mu} + \frac{1-\eta}{N\eta}(1-N\eta\alpha)^2 U^2\right] \quad (22)$$

To compare the noise figure of the feedback amplifier with the open-loop case $R_1$ and $R_2$ are assumed for simplicity to be large compared with $Nr_{sd}$ which leads to a $\alpha = R_2/(R_f + R_2)$, $U = 1/(1-N\eta\alpha)$ and $$W = \frac{r_d}{R_g} + N\left(\frac{r_d}{R_g}\right) \quad (23)$$

For the open-loop amplifier, $R_f \gg R_2$ so that $\alpha$ and 0 and $U=1$. When feedback is use $R_f \ll R_2$ so that $\alpha=1$ and $U=1/(1-N\eta)$. In both cases (22) simplifies to $$F = 1 + \frac{Nr_d}{R_g}\left(\frac{r_s}{r_d} + \frac{\mu}{2}\right) + \left(\frac{1-\eta}{\eta}\right)\left(\frac{\mu R_g}{2Nr_d}\right) \quad (24)$$

That is, under ideal bias conditions, the noise figure of the amplifier is independent of positive feedback. This is equivalent to saying that the output SNR of the amplifier is not affected by the applied feedback (as the input SNR may be fixed at a constant).

When $\eta=1$, the last term of (24) vanishes and the noise figure decreases as $R_g$ increases. When the quantum efficiency is less than unity, the same term will contribute to the rise of the noise figure for large source resistance. Differentiating (24) with respect to $R_g$ gives the optimum source resistance for minimum noise figure.

$$R_g = Nr_d \sqrt{\frac{2\eta}{(1-\eta)\mu}\left(\frac{r_s}{r_d} + \frac{\mu}{2}\right)} \quad (25)$$

The corresponding minimum noise figure is then given by $$F(\min) = 1 + 2\sqrt{\left(\frac{1-\eta}{\eta}\right)\left(\frac{r_s}{r_d} + \frac{\mu}{2}\right)\frac{\mu}{2}} \quad (26)$$

which is independent of the number of light emitters used. In practice, finite bias resistances will increase F(min) slightly.

Figure 5:
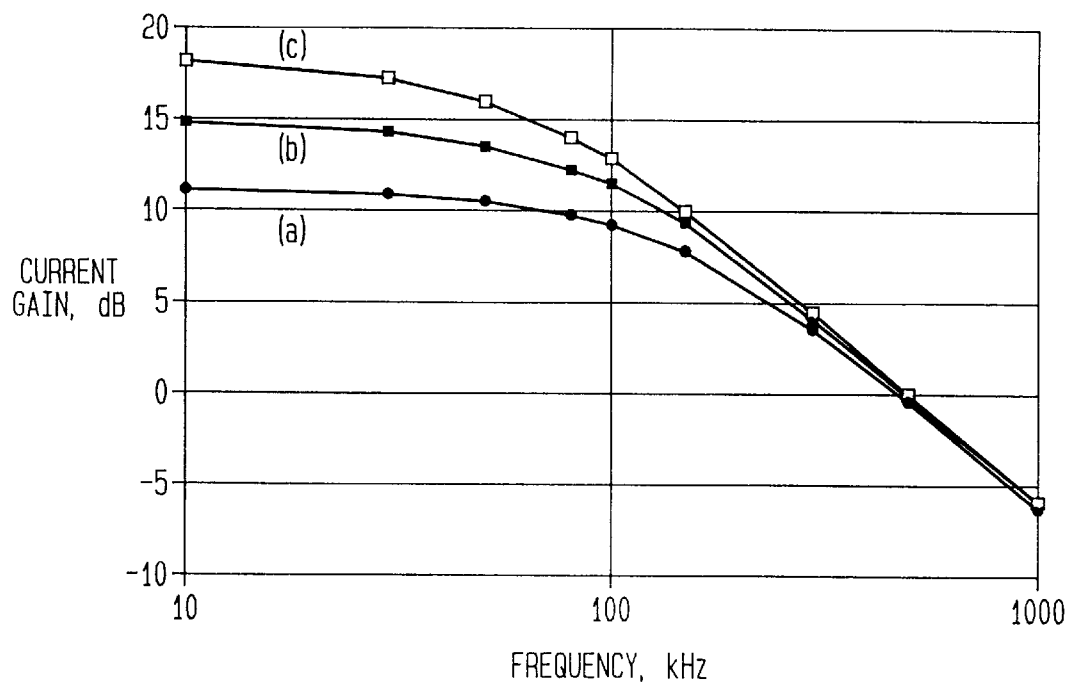
FIG. 5 is a plot of current gain of the photon coupled amplifier with feedback resistance equal to (a) 30, (b) 15 and (c) 7.5 k ohms.
Figure 6:
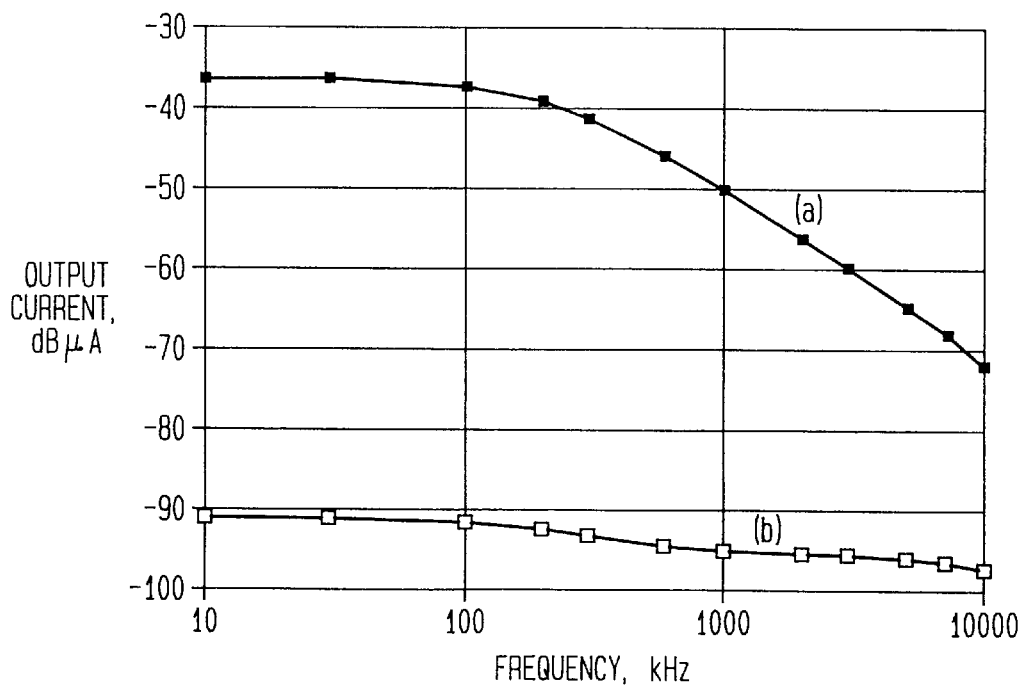
FIG. 6 is a plot of the frequency spectra of the photon coupled amplifier output currents of (a) signal and (b) noise.

For the purposes of verification of the operation of the photon coupled amplifier of FIG. 1, an photon coupled amplifier based on a Hamamatus type L2656 AlGaAs/GaAs Heterojunction LED was modelled in Pspice using known techniques. The parameters used for the LED were:

$r_d = 34.4\Omega$ (at 1 mA), $r_s = 3.6\Omega$, $\mu = 1.323$ and $\tau_c = 9.297$ $\mu$s. With $V_g = 1$ $\mu$V, $R_g = 160$ $\Omega R_1 = R_2 = 100$ k$\Omega$, $N=1$ and $\eta = 0.95$, the current gain of the amplifier is obtained as shown in FIG. 5. Curves (a), (b) and (c) are the current gains with the feedback resistance equal to 30, 15 and 7.5 k$\Omega$ respectively. It is clearly demonstrated that, as positive feedback is increased, the current gain goes up and the bandwidth decreases correspondingly. FIG. 6 shows the frequency spectra of the output signal and noise currents of the amplifier with the same parameters used to obtain curve (b) in FIG. 5. With constant input voltage, the 3-dB bandwidth of the output current spectrum is wider than that of the current gain response because the input current $i_1$ increases at high frequencies due to the shunting effect of the LED capacitance. The output SNR at low frequencies can be obtained directly from the spectral plots which is 54.25 dB and the input SNR obtained from (21) is 55.77 dB, thus giving a noise figure of 1.52 dB which agrees with calculation by (22).

Figure 7:
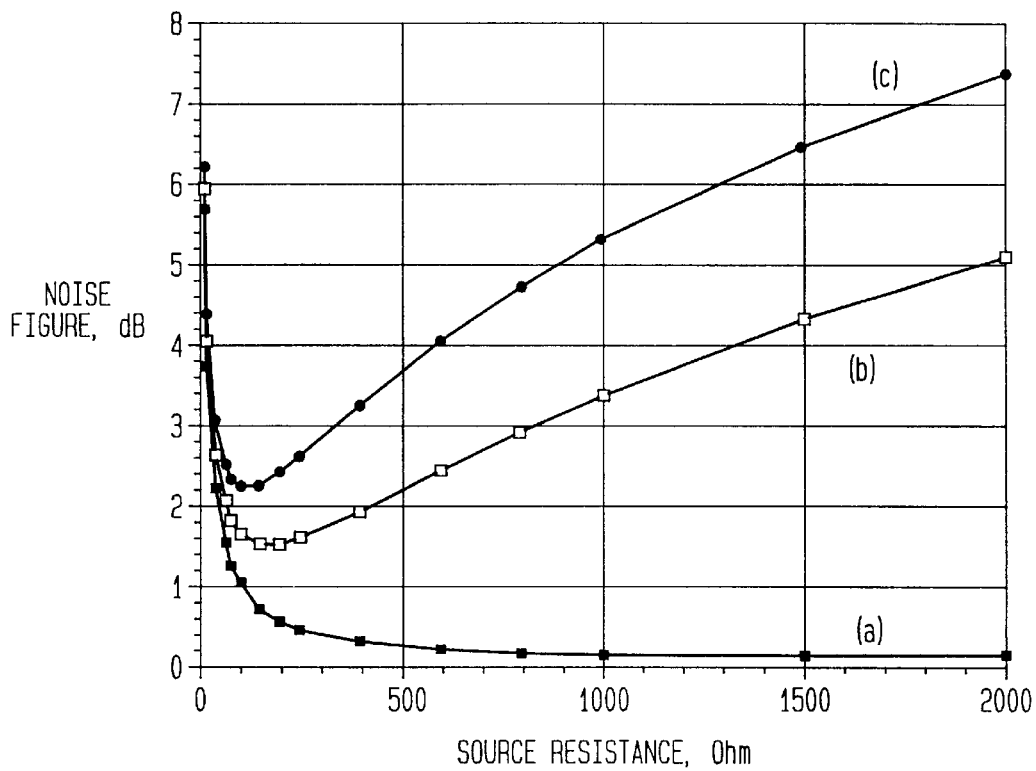
FIG. 7 shows a plot of a noise figure variation with a source resistance at different quantum efficiencies.

FIG. 7 shows the noise figure of the positive feedback amplifier with a single LED in the array (N=1). The results are calculated as a function of the source resistance using the general expression (22) with $R_1=R_2=100$ k$\Omega$. Curve (a) is for the ideal case of $\eta=1$. The noise figure decreases monotonically to 0 dB as the source resistance increases. This is due to high impedance suppression of the shot noise in the LED. Approximately the same noise figure is obtained when the feedback factor is varied between 0 and 1.

Curves (b) and (c) are the noise figures obtained for $\eta=0.95$ and 0.9, respectively. In both cases, increasing the source resistance no longer reduces the amplifier noise figure monotonically. As the source resistance increases, the short noise is suppressed as before but the partition noise which increases as $\eta$ decreases, becomes dominant hence causing an increase in noise figure. As the source resistance becomes very small, the shot noise current through the LED gradually increases, again causing an increase in noise figure. A minimum noise figure occurs at some intermediate value of the source resistance. For example in curve (b), the minimum noise figure is 1.15 dB and the optimum value of $R_g$ is 160$\Omega$ which agrees with calculation using (25). FIG. 7 also shows that the noise figure of the feedback amplifier improves as $\eta$ increases. This is obviously due to the reduction of partition noise in the amplifier at high quantum transfer efficiency.

Figure 8:
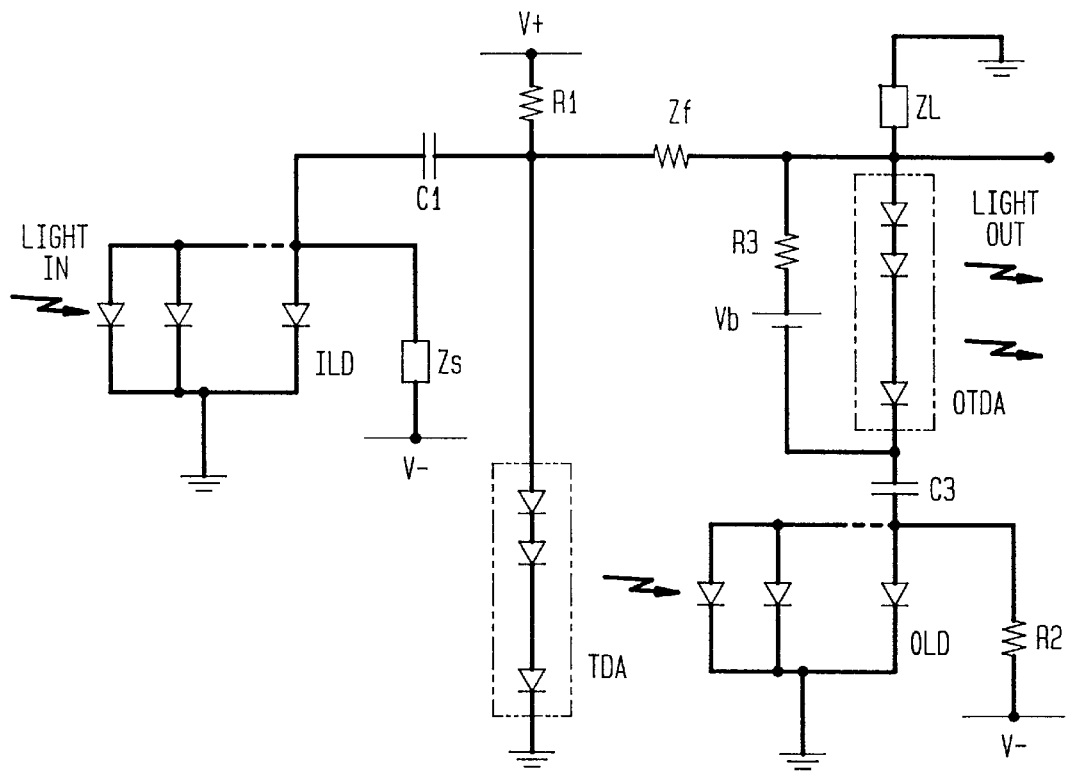
FIG. 8 shows a second embodiment of a photon coupled amplifier according to this invention.

Referring to FIG. 8, the current modulator formed by $V_g$ and $R_g$ in FIG. 1 is replaced by an input light detecting system, ILD. The current generated by ILD when light falls on it is used to modulate the array of light emitters. This current is amplified in the same way as in the form of the invention shown in FIG. 1, with the TDA bias and OLD bias currents provided in the same way. Resistance R3 and voltage supply $V_b$ provide DC bias current for the output light emitting array, OTDA.

The output current from OLD is used to modulate the current in the laser diode or light emitting array, OTDA. Capacitor C3 couples the signal from OLD to OTDA. Impedances $Z_I$ and $Z_f$ together determine the feedback factor $\beta$. The circuit functions as a low noise light amplifier.

Figure 9:
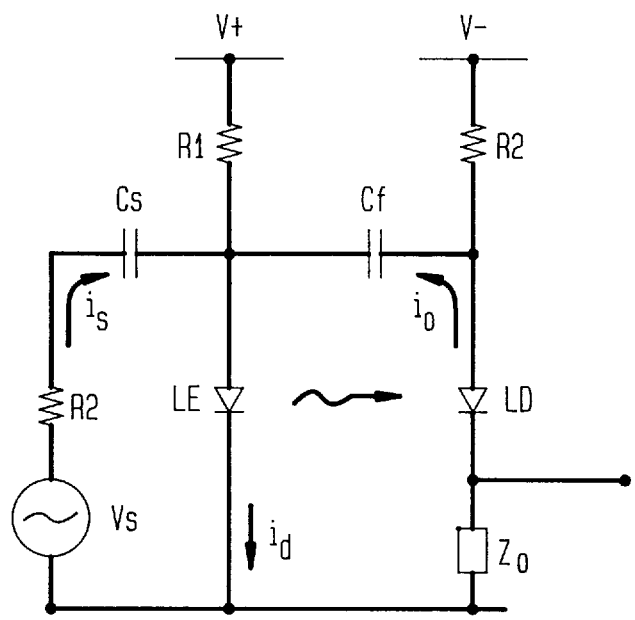
FIG. 9 shows a third embodiment of a photon coupled amplifier according to this invention.

Another embodiment of the invention is shown in FIG. 9. In FIG. 9 the LED array labelled TDA shown in FIG. 1 consists of a single light emitting diode or laser diode and the detecting system consists of a single detector.

Providing the quantum transfer efficiency, otherwise called the open-loop current gain, between the light emitting element and the detector is greater than one half, the closed-loop current gain of this configuration can exceed unity. In this form of the invention a current gain exceeding unity can thus be obtained by applying positive current feedback from a single detector to a single emitter.

Referring to FIG. 9, voltage source $v_g$, with resistance $R_g$ generates current $i_s$ to drive the light emitter LE through coupling capacitor $C_s$. The DC bias current for the semiconductor light emitting junction is provided through resistance $R_1$ from the positive voltage power supply V+. Semiconductor light detector LD is optically coupled to light emitter LE to provide open-loop current transfer ratio ($\eta=i_o/i_d$) of at least one half. DC bias current for the semiconductor junction diode detector is provided through resistance $R_2$ from power supply V−. Positive current feedback is provided via capacitor $C_f$. The output signal may be measured in the form of a voltage drop across impedance $Z_0$.

The use of high impedances for $R_2$, $R_1$ and $Z_s$ is necessary to obtain large suppression of the diode shot noise current which may otherwise flow through the light emitting element and be amplified. Almost all the output current $i_o$ then flows back via $C_f$ through the light emitter LE and the closed loop current gain is then approximately equal to $\eta/(1-\eta)$.

Photon partition noise is minimised by arranging the open-loop current transfer ratio, otherwise called the quantum transfer efficiency, to be as close to unity as possible.

The circuit of FIG. 9 can also be used as the basis of a lightwave amplifier and receiver by inputting light directly to detector LD.

It will be apparent that the best performance of the photon coupled circuit according to this invention is achieved using a single mode laser diode, resonant cavity LED, or micro cavity laser diode or LED with the highest possible quantum efficiency. Currently available LEDs have an external efficiency at room temperature in excess of 85%.

We claim:

1. A sub-shot noise, optoelectronic amplifier circuit comprising a high quantum efficiency semiconductor light emitter; means to provide signal input current and bias current to said light emitter, the light output of said light emitter being controlled by the current flowing therein; a high quantum efficiency semiconductor light detector optically coupled with low photon losses to said light emitter to provide an overall quantum transfer efficiency in excess of 0.5; means to provide a bias voltage to said light detector, the current flowing in said light detector being controlled by the light received from said light emitter and used to provide an output signal; means to isolate a portion of the alternating current flowing in said detector and to feed this portion of the alternating current back to reinforce or oppose the signal current flowing in the light emitter.

2. A circuit as claimed in claim 1 wherein said feedback is positive to reinforce the signal current flowing in the light emitter and thus to provide increased current gain.

3. A circuit as claimed in claim 1 wherein said feedback is negative to oppose the signal current flowing in the light emitter and thus to provide stable gain with increased bandwidth.

4. A circuit as claimed in claim 1 wherein said light emitter comprises an array of semiconductor light emitters.

5. A circuit as claimed in claim 4 wherein said array comprises a plurality of semiconductor laser diode or light emitting diode junctions electrically connected in series and/or in parallel, driven by a high impedance signal current source.

6. A circuit as claimed in claim 4, wherein the circuit has an open loop gain that is much greater than 1 to which negative feedback is applied to increase the bandwidth.

7. A circuit as claimed in claim 1 wherein said light emitter is a single semiconductor device.

8. A circuit as claimed in claim 7 wherein said semiconductor device comprising the light emitter is a single light emitting diode, single light emitting junction, single laser diode or single laser diode junction.

9. A circuit as claimed in claim 7 wherein the quantum transfer efficiency of said coupling is at least 75%.

10. A circuit as claimed in claim 1 wherein the light detector comprises one or more back biassed photodetectors operating in photoconductive mode.

11. A circuit as claimed in claim 1 wherein the low loss optical coupling is achieved by close physical positioning.

12. A circuit as claimed in claim 1 wherein the low loss optical coupling is achieved by using an optical wave guide or low loss light pipe.

13. A circuit as claimed in claim 11 wherein said circuit is in the form of an optoelectronic integrated circuit.

14. A circuit as claimed in claim 1 further comprising a second semiconductor light detector, the output current of said second light detector modulating the current flowing in said light emitter.

15. A circuit as claimed in claim 14 wherein said second light detector is adapted to receive an input light signal from an external source and the current flowing in the light detector is modulated by the input light signal.

16. A circuit as claimed in claim 15 further comprising a light output device driven by the amplified current from said light detector.

17. A circuit as claimed in claim 16 wherein said light output device comprises one or more semiconductor laser diode or light emitting junctions.

* * * * *